(12) United States Patent
Kelkar et al.

(10) Patent No.: US 6,940,324 B2
(45) Date of Patent: Sep. 6, 2005

(54) VARIATION OF EFFECTIVE FILTER CAPACITANCE IN PHASE LOCK LOOP CIRCUIT LOOP FILTERS

(75) Inventors: Ram Kelkar, South Burlington, VT (US); Anjali R. Malladi, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,121

(22) Filed: Nov. 21, 2003

(65) Prior Publication Data

US 2005/0110534 A1 May 26, 2005

(51) Int. Cl.⁷ ............................................. H03L 7/06
(52) U.S. Cl. ..................... 327/157; 327/156; 327/148
(58) Field of Search ................................ 327/147–150, 327/156–158

(56) References Cited

U.S. PATENT DOCUMENTS 5,828,255 A * 10/1998 Kelkar et al. ............... 327/157
6,377,091 B1 * 4/2002 Williams et al. ............ 327/156
6,600,351 B2 * 7/2003 Bisanti et al. .............. 327/157
6,710,666 B1 * 3/2004 Wu et al. ..................... 331/17

* cited by examiner

Primary Examiner—Dinh T. Le

(74) Attorney, Agent, or Firm—Schmeiser, Olsen & Watts; Richard A. Henkler

(57) ABSTRACT

A structure and associated method for varying an effective capacitance within a phase lock loop circuit. The phase lock loop circuit comprises a first charge pump circuit, a second charge pump circuit, and a loop filter circuit. The loop filter circuit comprises a filter capacitor with a constant capacitance value. The first charge pump circuit is electrically connected to the loop filter. The first charge pump circuit to controls a flow of current for the loop filter. The loop filter provides a voltage for a voltage controlled oscillator. The second charge pump circuit is electrically connected to the loop filter circuit in parallel with the filter capacitor. The first charge pump circuit and the second charge pump circuit vary an effective capacitance value of the filter capacitor.

10 Claims, 4 Drawing Sheets

VARIATION OF EFFECTIVE FILTER CAPACITANCE IN PHASE LOCK LOOP CIRCUIT LOOP FILTERS

BACKGROUND OF INVENTION

1. Technical Field

The present invention relates to a structure and associated method to vary an effective capacitance in a phase lock loop circuit comprising a loop filter.

2. Related Art

Parameters of electrical circuits typically require optimization. An electrical circuit comprising parameters that are not optimized may not perform efficiently and therefore may malfunction. Therefore there exists a need to optimize parameters of electrical circuits.

SUMMARY OF INVENTION

The present invention provides a phase lock loop circuit, comprising:

a first charge pump circuit, a second charge pump circuit, and a loop filter circuit within the phase lock loop circuit, the loop filter circuit comprising a filter capacitor with a constant capacitance value, the first charge pump circuit being electrically connected to the loop filter, the first charge pump circuit being adapted to control a flow of current for the loop filter, the loop filter being adapted to provide a voltage for a voltage controlled oscillator, the second charge pump circuit being electrically connected to the loop filter circuit in parallel with the filter capacitor, and the first charge pump circuit and the second charge pump circuit being adapted to collectively vary an effective capacitance value of the filter capacitor.

The present invention provides a method for optimizing a phase lock loop circuit, comprising:

providing a first charge pump circuit, a second charge pump circuit, and a loop filter circuit within the phase lock loop circuit, the loop filter circuit comprising a filter capacitor with a constant capacitance value, the first charge pump circuit being electrically connected to the loop filter, and the second charge pump circuit being electrically connected to the loop filter circuit in parallel with the filter capacitor;

controlling, by the first charge pump circuit, a flow of current for the loop filter;

varying, by the first the first charge pump circuit and the second charge pump circuit, an effective capacitance value of the filter capacitor; and providing, by the loop filter, a voltage for a voltage controlled oscillator.

The present invention advantageously provides a structure and associated method to optimize parameters of electrical circuits.

DETAILED DESCRIPTION

Figure 1:
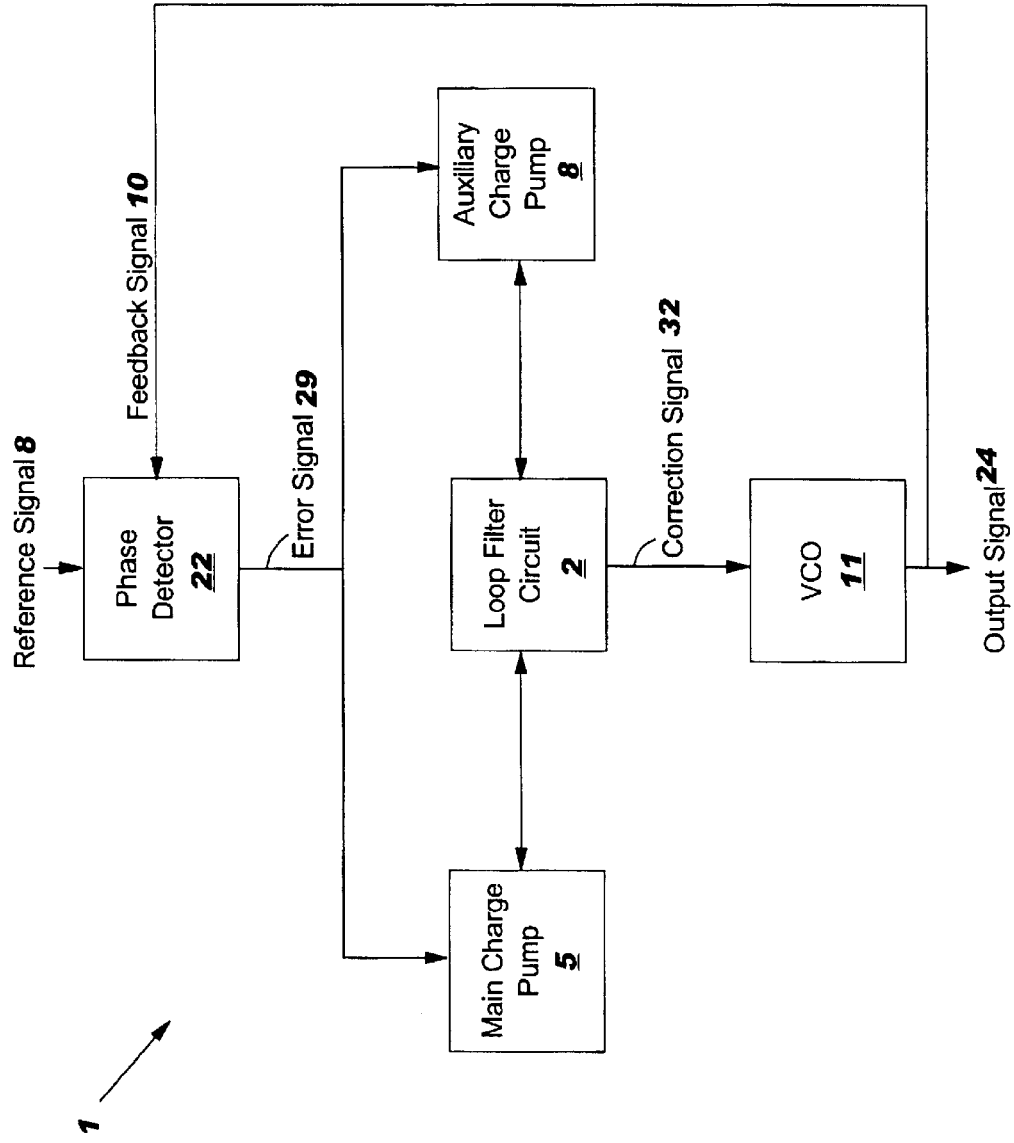
FIG. 1 illustrates a block diagram view of a phase lock loop (PLL) circuit, in accordance with embodiments of the present invention.

FIG. 1 illustrates a block diagram view of a phase lock loop (PLL) circuit 1 comprising a phase detector 22, a loop filter circuit 2, a main charge pump circuit 5, an auxiliary charge pump circuit 8, and a voltage controlled oscillator (VCO) 11, in accordance with embodiments of the present invention. The phase detector 22 compares a phase and frequency of a reference signal 8 to a phase and frequency of a feedback signal 10 from the VCO 11. The phase detector 22 generates an error signal 29 representing the phase and frequency difference between the reference signal 8 and the feedback signal 10. The error signal 29 is transmitted to the main charge pump circuit 5 and the auxiliary charge pump circuit 8. Based on the error signal 29, the main charge pump circuit 5, the auxiliary charge pump circuit 8, and the loop filter circuit 2 collectively produce a correction signal 32 that controls the VCO to produce an output signal 24 that tracks the reference signal 8 (i.e., output signal 24 tracks a phase and frequency of the reference signal 8). The feedback signal 10 is equivalent to or a sample of the output signal 24. A relationship between the main charge pump circuit 5, the auxiliary charge pump circuit 8, and the loop filter circuit 2 is described in detail in the description of FIG. 2, infra.

Figure 2:
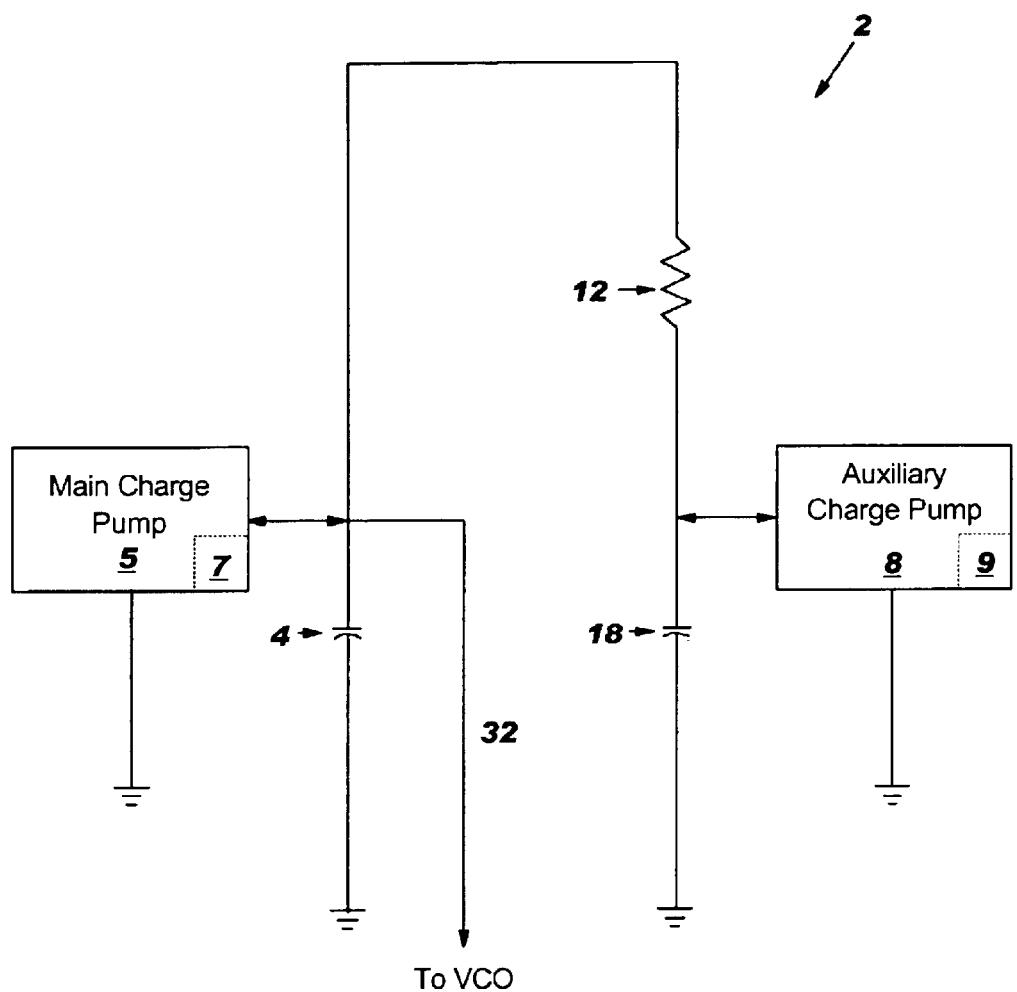
FIG. 2 illustrates a schematic of the loop filter circuit in FIG. 1 in relation to the main charge pump circuit and the auxiliary charge pump circuit, in accordance with embodiments of the present invention.

FIG. 2 illustrates a schematic of the loop filter circuit 2 in relation to the main charge pump circuit 5 and the auxiliary charge pump circuit 8, in accordance with embodiments of the present invention. The loop filter circuit 2 comprises a first capacitor 4, a second capacitor 18 (e.g., filter capacitor), and a resistor 12. The first capacitor 4 is electrically connected to the resistor 12. The resistor 12 is electrically connected to the second capacitor 18. The first capacitor 4 is in parallel with the resistor 12 and the second capacitor 18. The resistor 12 comprises a fixed resistance R1. The first capacitor 4 comprises a fixed capacitance C1. The second capacitor 18 comprises a fixed capacitance C2. The main charge pump circuit 5 may inject (i.e., source) current to the loop filter circuit 2. Alternatively, the main charge pump circuit 5 may remove (i.e., sink) current from the loop filter circuit 2. The source or sink function of the main charge pump circuit 5 may be controlled by a user. The auxiliary charge pump circuit 8 is electrically connected to the loop filter circuit 2 in parallel with the second capacitor 18. The auxiliary charge pump circuit 8 may inject (i.e., source) current to the second capacitor 18. Alternatively, the auxiliary charge pump circuit 8 may remove (i.e., sink) current from the 2 second capacitor 18. The source or sink function of the auxiliary charge pump circuit 8 may be controlled by the user. The main charge pump circuit 5 may comprise an adjustable gain control 7 so that the user may vary a current gain of the main charge pump circuit 5 (Gm). The auxiliary charge pump circuit 8 may comprise an adjustable gain control 9 so that the user may vary a current gain of the main charge pump circuit 5 (Ga). By changing the current gain Ga of the auxiliary charge pump circuit 8 in relation to the current gain Gmof the main charge pump circuit 5, an effective capacitance value of the second capacitor 18 (Ceff) may be controlled. The effective capacitance value Ceff is a value of capacitance that the second capacitor 18 appears to have. Although the second capacitor 18 comprises the fixed capacitance value C2, the effective capacitance Ceff value is higher or lower than the fixed capacitance value C2. By changing both gains Ga and Gm relative to each other, a wide range of effective capacitance values Ceff for the second capacitor 18 is obtained. When the main charge pump circuit 5 and the auxiliary charge pump circuit 8 both flow current in a same direction (i.e., the main charge pump circuit 5 and the auxiliary charge pump circuit 8 both sink current or both source current), a value for Ceff is determined by the following first equation: Ceff=(C2*Gm)/(Gm+Ga). Using the first equation, Ceff decreases as Ga increases. When the main charge pump circuit 5 and the auxiliary charge pump circuit 8 each flow current in opposite directions (i.e., the main charge pump circuit 5 sinks current and the auxiliary charge pump circuit 8 sources current or vice versa), a value for Ceff is determined by the following second equation: Ceff=(C2*Gm)/(Gm−Ga) with a limitation that Ga<Gm. Using the second equation, Ceff increases as Ga increases. It is readily apparent that if both Gm and Ga are varied, then Ceff can be varied over a wider range then if just Gm or Ga is varied. For example, if Gm=1, Ga=0.5, and C2=350 picofarads (pF) then using the first equation produces a Ceff of 233 pF and using the second equation produces a Ceff of 700 pF thereby giving Ceff a range of 233 pF–700 pF. The variation of Ceff allows for optimization of phase lock loop circuit 1 parameters such as, inter alia, bandwidth, peaking/damping factor (ζ), noise reduction, etc. A relationship between the damping factor ζ and Ceff and is shown by the following equation:

$$\zeta = (R_1/2) * \sqrt{(G_m * I_{ref} * K_1 * C_{eff})/1}$$

The current value $I_{ref}$ in the preceding equation is a reference current applied to the phase lock loop circuit 1. The value $K_1$ in the preceding equation is a DC portion of a gain of the VCO 11.

As shown by the preceding equation, the damping factor ζ goes up as $C_{eff}$ is increased. A higher damping factor allows the phase lock loop circuit 1 to respond to an abrupt change in the input signal frequency without excessive overshooting (e.g., see FIG. 5). A bandwidth of the phase lock loop circuit 1 is defined as a frequency at which a closed loop gain $G_{cl}$ of the phase lock loop circuit 1 is equal to −3 decibels (db). The closed loop gain $G_{cl}$ of the phase lock loop circuit 1 is shown by the following formula:

$$G_{cl} = (G_m * I_{ref} * K_1 * (s+\omega_z))/(s^3 * C_2 + s^2 * C_2 * \omega_p + G_m * I_{ref} * K_1 * (s+\omega_z))$$

The symbol s represents the Laplace transform operator. The value $\omega_z = 1/(R_1 * C_{eff})$. The value $\omega_p = 1/(R_1 * C_2)$. Therefore, because the bandwidth is related to the closed loop gain $G_{cl}$ and the closed loop gain $G_{cl}$ is dependent upon $C_{eff}$ (see $\omega_z = 1/(R_1 * C_{eff})$), it is evident that a variation of $C_{eff}$ will vary the the phase lock loop circuit 1 bandwidth. A wide range of $C_{eff}$ allows for a wide range of bandwidth for the phase lock loop circuit 1. Varying the bandwidth and damping factor for the phase lock loop circuit 1 allows for the rejection of noise (i.e., electrical noise) to the phase lock loop circuit 1 and therefore is a method of noise reduction. More than one phase lock loop circuit 1 parameter may varying simultaneously. For example, the bandwidth and damping factor for the phase lock loop circuit 1 may be varyed simultaneously. Examples of the effects of optimization of a damping factor of the phase lock loop circuit 1 are described in FIGS. 3, 4, and 5.

Figure 3:
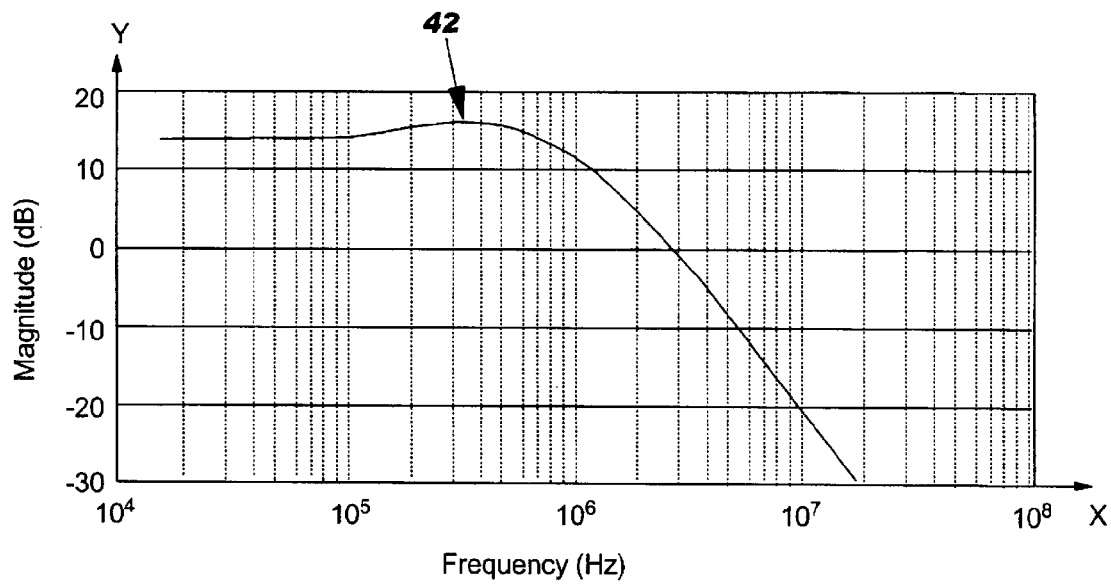
FIG. 3 illustrates a graph of a gain verses a frequency for the phase lock loop circuit 1 of FIG. 1, in accordance with embodiments of the present invention.

FIG. 3 illustrates a graph of a gain from the input reference signal 8 to the output signal 24 from the VCO verses frequency for the phase lock loop circuit 1 of FIG. 1, in accordance with embodiments of the present invention. The X-axis represents the frequency in hertz (Hz) for the phase lock loop circuit 1. The Y-axis represents the magnitude of the gain in decibels (dB). A value of $C_{eff}$ has been set to 116 pF. It can be seen on the graph of FIG. 3 that the gain has a peaking effect 42 starting at about $10^5$ Hz (i.e., magnitude slightly rising from about 14 dB to about 17 dB). The peaking effect 42 has the tendency of amplifying any electrical noise that may be part of the input reference signal 8 thus causing excessive noise on the output signal 24. The peaking effect 42 is caused by the damping factor ζ (see description of FIG. 2) being less than optimum, thereby causing the phase lock loop circuit 1 to be underdamped. The peaking effect 42 is removed in FIG. 4 by changing the value of $C_{eff}$ as described infra.

Figure 4:
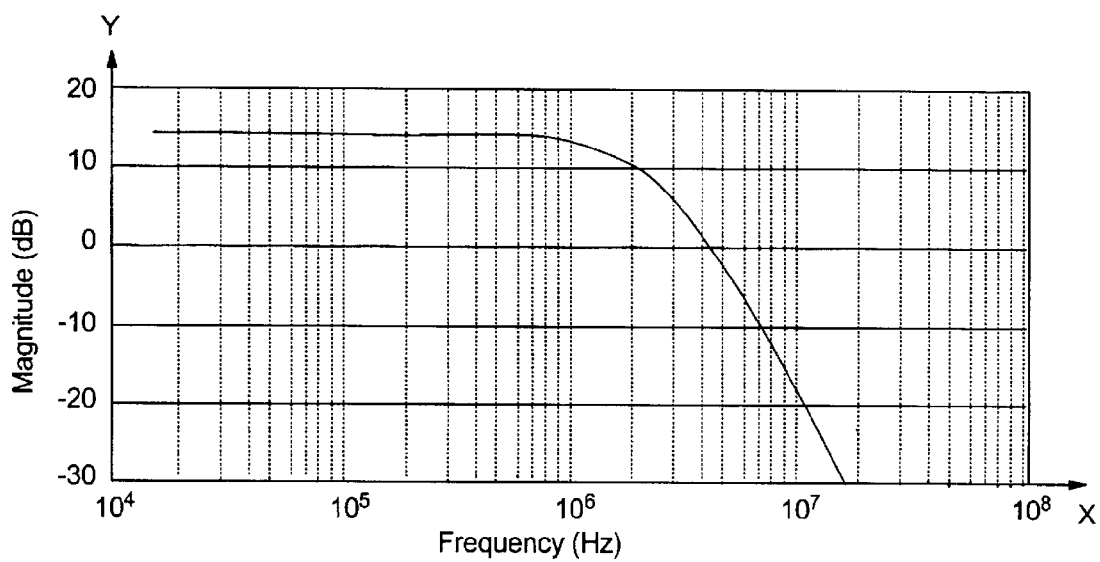
FIG. 4 illustrates a graph of a gain verses a frequency for the phase lock loop circuit 1 of FIG. 1 with the peaking effect of FIG. 3 removed, in accordance with embodiments of the present invention.

FIG. 4 illustrates a graph of a gain from the input reference signal 8 to the output signal 24 from the VCO verses frequency for the phase lock loop circuit 1 of FIG. 1 with the peaking effect 42 of FIG. 3 removed, in accordance with embodiments of the present invention. The X-axis represents the frequency in hertz (Hz). The Y-axis represents the magnitude of the gain in decibels (dB). A value of $C_{eff}$ has been set to 700 pF. It can be seen on the graph of FIG. 4 that the the peaking effect 42 of FIG. 3 has been removed and the magnitude of the gain comprises a steady value of about 14 dB. Therefore the damping factor for the phase lock loop circuit 1 has been optimized by changing the value of $C_{eff}$ thereby causing the phase lock loop circuit 1 to be properly damped.

Figure 5:
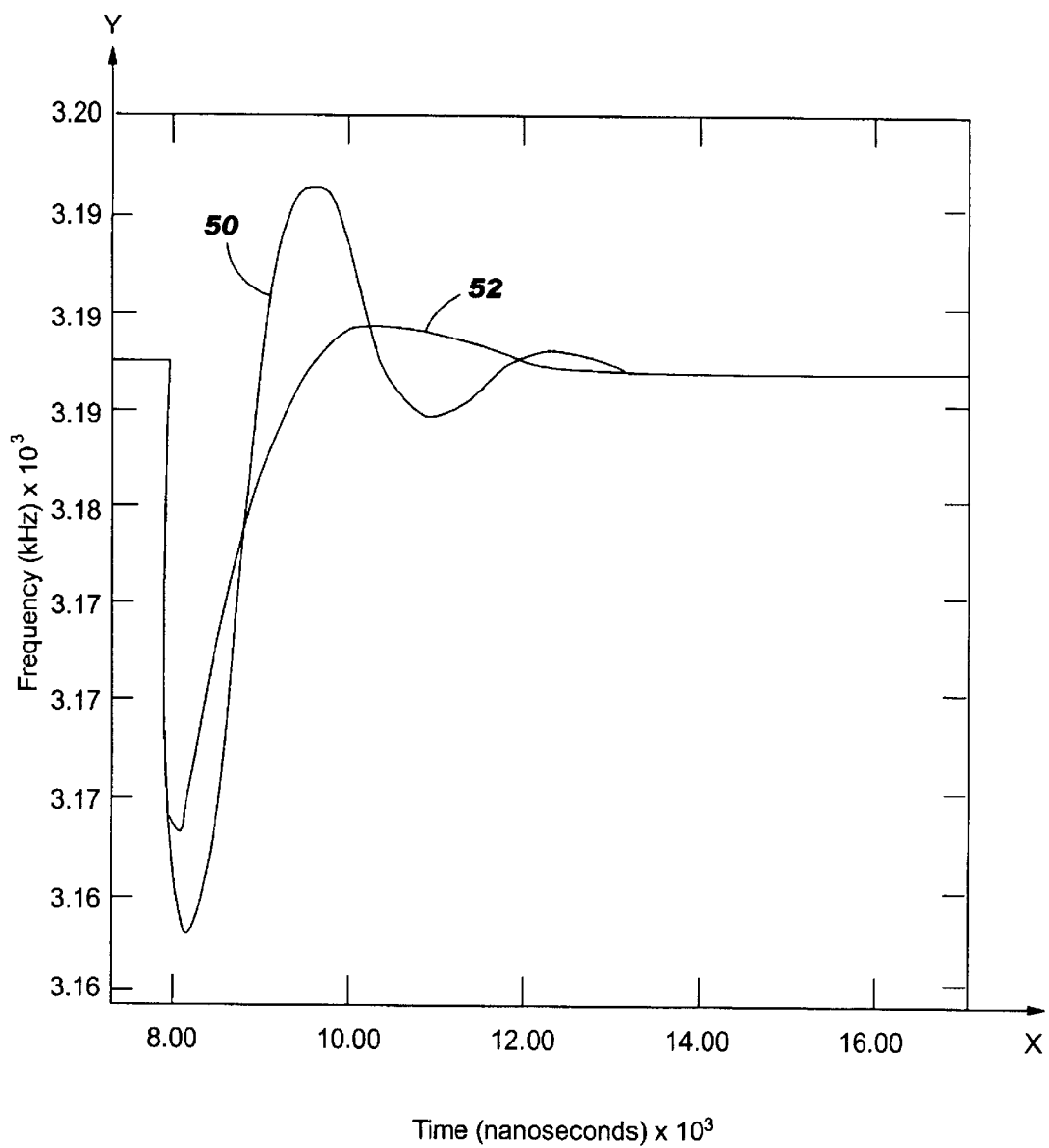
FIG. 5 illustrates a graph showing an effect of an abrupt change to an input frequency, in accordance with embodiments of the present invention.

FIG. 5 illustrates a graph showing an effect on a frequency of the output signal 24 by abruptly changing a frequency of the input reference signal 8 for the phase lock loop circuit 1 of FIG. 1, in accordance with embodiments of the present invention. The Y-axis represents the frequency of the output signal 24 in kilohertz. The X-axis represents time in nanoseconds. The plots 50 and 52 both show a response of the output signal 24 frequency to an abrupt change of the input clock frequency of the input reference signal 8. For the plot 50, the auxiliary charge pump 8 has been turned off and therefore $G_a = 0$ and $C_{eff} = C_2$. Due to the abrupt change in the input clock frequency, the plot 50 shows an under damped oscillatory response of the the output signal 24 frequency. The output signal 24 frequency does not stop oscillating until about 14 nanoseconds. The plot 52 shows the effect that increasing $C_{eff}$ (i.e., the auxiliary charge pump 8 has been turned back on for the same abrupt change in the input clock frequency of the input reference signal 8 for the plot 50) has on the oscillation of the output signal 24 frequency during the abrupt change of frequencies. As shown by the plot 52, there is very little oscillation during the abrupt change of frequencies thereby causing a more damped response to the abrupt change in frequencies than the plot 50. It is readily apparent that by increasing $C_{eff}$ the damping factor is increased and therefore the plot 52 recovers from oscillation quicker than the plot 50.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A phase lock loop circuit, comprising:
   a first charge pump circuit, a second charge pump circuit, and a loop filter circuit within the phase lock loop circuit, the first charge pump circuit comprising a first adjustable gain, the second charge pump circuit comprising a second adjustable gain, the loop filter circuit comprising a filter capacitor with a constant capacitance value C, the first charge pump circuit being electrically connected to the loop filter circuit, the second charge pump circuit being electrically connected to the loop filter circuit in parallel with the filter capacitor, the first charge pump circuit being adapted to source a first current to said loop filter circuit, the second charge pump circuit being adapted to source a second current to said loop filter circuit, the first charge pump circuit and the second charge pump circuit being adapted to collectively decrease an effective capacitance value $C_{eff}$ of the filter capacitor by adjusting said first adjustable gain to a first gain value $G_m$ and said second adjustable gain to a second gain value $G_a$, the effective capacitance value $C_{eff}$ being determined by an equation $C_{eff}=(C*G_m)/(G_m=G_a)$, and the loop filter being adapted to provide a voltage for a voltage controlled oscillator.

2. The phase lock loop circuit of claim 1, wherein the first charge pump circuit and the second charge pump circuit are further adapted to collectively vary a bandwidth of the phase lock loop circuit.

3. The phase lock loop circuit of claim 1, wherein the first charge pump circuit and the second charge pump circuit are further adapted to collectively vary a damping factor of the phase lock loop circuit.

4. The phase lock loop circuit of claim 1, wherein the first charge pump circuit and second charge pump circuit are further adapted to collectively reduce noise signals from an output signal of the phase lock loop circuit.

5. The phase lock loop circuit of claim 1, wherein the first charge pump circuit and the second charge pump circuit are further adapted to collectively vary a bandwidth and a damping factor of the phase lock loop circuit simultaneously.

6. A method for optimizing a phase lock loop circuit, comprising:

providing a first charge pump circuit, a second charge pump circuit, and a loop filter circuit within the phase lock loop circuit, the first charge pump circuit comprising a first adjustable gain, the second charge pump circuit comprising a second adjustable gain, the loop filter circuit comprising a filter capacitor with a constant capacitance value C, the first charge pump circuit being electrically connected to the loop filter, and the second charge pump circuit being electrically connected to the loop filter circuit in parallel with the filter capacitor;

sourcing by the first charge pump circuit, a first current to said loop filter circuit;

sourcing by the second charge pump circuit, a second current to said loop filter circuit;

decreasing an effective capacitance value $C_{eff}$ of the filter capacitor by adjusting said first adjusable gain to a first value $G_m$ and said second adjustable gain to a second gain value $G_a$, wherein the effective capacitance value $C_{eff}$ is determined by an equation $C_{eff}=(C*G_m)/(G_m+G_a)$; and providing, by the loop filter, a voltage for a voltage controlled oscillator.

7. The method of claim 6, further comprising varying, by the first the first charge pump circuit and the second charge pump circuit, a bandwidth of the phase lock loop circuit.

8. The method of claim 6, further comprising varying, by the first the first charge pump circuit and the second charge pump circuit, a damping factor of the phase lock loop circuit.

9. The method of claim 6, further comprising reducing, by the first the first charge pump circuit and the second charge pump circuit, noise signals from an output signal of the phase lock loop circuit.

10. The method of claim 6, further comprising varying, by the first charge pump circuit and the second charge pump circuit, a bandwidth and a damping factor of the phase lock loop circuit simultaneously.

* * * * *

UNITED STATES PATENT AND TRADEMARK OFFICE
CERTIFICATE OF CORRECTION

PATENT NO. : 6,940,324 B2
DATED : September 6, 2005
INVENTOR(S) : Kelkar et al.

It is certified that error appears in the above-identified patent and that said Letters Patent is hereby corrected as shown below:

Column 1,
Line 47, delete "the first the first" and insert -- the first --.

Column 5,
Line 18, delete "$C_{eff}=(C*G_m)/(G_m=G_a)$" and insert -- $C_{eff}=(C*G_m)/(G_m+G_a)$ --.

Column 6,
Lines 29 and 32, delete "the first the first" and insert -- the first --.

Signed and Sealed this

Twenty-second Day of November, 2005

JON W. DUDAS
*Director of the United States Patent and Trademark Office*